United States Patent
Yosui

(10) Patent No.: US 9,854,682 B2
(45) Date of Patent: Dec. 26, 2017

(54) COMPONENT INCORPORATING SUBSTRATE AND METHOD FOR MANUFACTURING COMPONENT INCORPORATING SUBSTRATE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/372,440

(22) Filed: Dec. 8, 2016

(65) Prior Publication Data

US 2017/0094798 A1  Mar. 30, 2017

Related U.S. Application Data

(63) Continuation of application No. PCT/JP2015/066815, filed on Jun. 11, 2015.

(30) Foreign Application Priority Data

Jun. 23, 2014 (JP) .................................. 2014-128193

(51) Int. Cl.
H05K 1/18 (2006.01)
H05K 1/03 (2006.01)
(Continued)

(52) U.S. Cl.
CPC ............ *H05K 1/188* (2013.01); *H05K 1/0313* (2013.01); *H05K 1/09* (2013.01); *H05K 1/115* (2013.01);
(Continued)

(58) Field of Classification Search
CPC ........ H05K 1/0313; H05K 1/09; H05K 1/115; H05K 1/188; H05K 1/189;
(Continued)

(56) References Cited

U.S. PATENT DOCUMENTS 5,561,085 A * 10/1996 Gorowitz ............ H01L 23/5221 257/E23.143
6,166,438 A * 12/2000 Davidson ............ H01L 21/6835 257/700

(Continued)

FOREIGN PATENT DOCUMENTS

JP  2002-026230 A  1/2002
JP     3407727 B2  5/2003
(Continued)

OTHER PUBLICATIONS

Official Communication issued in corresponding International Application PCT/JP2015/066815, dated Aug. 4, 2015.

*Primary Examiner* — Yuriy Semenenko
(74) *Attorney, Agent, or Firm* — Keating & Bennett, LLP

(57) ABSTRACT

A laminated body of a component incorporating substrate includes insulating base members. First and second mounting terminals of a first electronic component abut on a conductor-less surface of a first insulating base member. A first interlayer connection conductor in the first insulating base member connects the first mounting terminal to a conductor pattern. Third and fourth mounting terminals of a second electronic component abut on a conductor-less surface of a second insulating base member. A second interlayer connection conductor in the second insulating base member connects the third mounting terminal to a conductor pattern that abuts a conductor pattern of the first insulating base member which faces toward the second insulating base member, and the conductor pattern of the second insulating base member faces toward the first insulating base member in a lamination direction.

20 Claims, 6 Drawing Sheets

(51) Int. Cl.
*H05K 3/46* (2006.01)
*H05K 3/40* (2006.01)
*H05K 3/24* (2006.01)
*H05K 1/09* (2006.01)
*H05K 1/11* (2006.01)

(52) U.S. Cl.
CPC ............. *H05K 1/189* (2013.01); *H05K 3/246* (2013.01); *H05K 3/4038* (2013.01); *H05K 3/4069* (2013.01); *H05K 3/4632* (2013.01); *H05K 3/4691* (2013.01); H05K 2201/0129 (2013.01); H05K 2201/0141 (2013.01); H05K 2201/10515 (2013.01); H05K 2203/065 (2013.01)

(58) Field of Classification Search
CPC ... H05K 2201/0129; H05K 2201/0141; H05K 2201/10515; H05K 2203/065; H05K 3/246; H05K 3/4038; H05K 3/4069; H05K 3/4632; H05K 3/4691
See application file for complete search history.

(56) References Cited

U.S. PATENT DOCUMENTS

| | | | |
|---|---|---|---|
| 8,053,283 B2* | 11/2011 | Gruber | H01L 21/486 257/E21.503 |
| 9,692,147 B1* | 6/2017 | Nekkanty | H05K 5/0086 |
| 2002/0003304 A1* | 1/2002 | Matsunaga | H01L 23/48 257/758 |
| 2008/0007927 A1 | 1/2008 | Ito et al. | |
| 2009/0032298 A1* | 2/2009 | Hayakawa | H05K 1/141 174/260 |
| 2009/0121326 A1* | 5/2009 | Kim | H01L 25/105 257/666 |

FOREIGN PATENT DOCUMENTS

| | | |
|---|---|---|
| JP | 2009-158616 A | 7/2009 |
| WO | 2007/069789 A1 | 6/2007 |

* cited by examiner

COMPONENT INCORPORATING SUBSTRATE AND METHOD FOR MANUFACTURING COMPONENT INCORPORATING SUBSTRATE

CROSS REFERENCE TO RELATED APPLICATIONS

This application claims the benefit of priority to Japanese Patent Application No. 2014-128193 filed on Jun. 23, 2014 and is a Continuation Application of PCT Application No. PCT/JP2015/066815 filed on Jun. 11, 2015. The entire contents of each application are hereby incorporated herein by reference.

BACKGROUND OF THE INVENTION

1. Field of the Invention

The present invention relates to a component incorporating substrate which incorporates a plurality of electronic components in the substrate, and a method for manufacturing the component incorporating substrate.

2. Description of the Related Art

Conventionally, various kinds of laminated bodies each incorporating a circuit pattern have been proposed. For example, according to Japanese Patent No. 3407727, a multilayer substrate incorporating a circuit pattern is formed by laminating a plurality of thermoplastic insulating base members and bonding them by heating under pressure.

According to the multilayer substrate disclosed in Japanese Patent No. 3407727, the thermoplastic insulating base members including conductors on their one surfaces are laminated with the conductor-containing surfaces facing toward the same direction with respect to the base members. Thus, according to the multilayer substrate disclosed in Japanese Patent No. 3407727, two conductor patterns provided on the base members in different layers are connected through an interlayer connection conductor which penetrates the base member disposed between the two conductor patterns. The interlayer connection conductor is formed in such a manner that a through hole is formed in the base member, this through hole is filled with electrically-conductive paste, and the electrically-conductive paste is solidified when the base members are bonded by heating under pressure.

As for this multilayer substrate, when a plurality of electronic components are incorporated in the different layers of the multilayer substrate, and a common conductor pattern is connected to the plurality of electronic components, it is necessary to provide wiring patterns for connecting the common conductor pattern to the respective electronic components.

FIG. 6 is a side surface cross-sectional view illustrating wiring patterns of a component incorporating substrate provided based on a conventional configuration. As illustrated in FIG. 6, a component incorporating substrate 10P provided based on the conventional configuration includes a laminated body 900P. The laminated body 900P is provided by laminating thermoplastic insulating base members 901, 902, 903, 904, 905, and 906. In this case, the insulating base members 903 to 906 are laminated with their conductor-containing surfaces facing toward the same direction with respect to the base members.

A common conductor pattern 931 and a conductor pattern 932 are formed on the surface of the insulating base member 903. A conductor pattern 941P is formed on the surface of the insulating base member 904, and a conductor pattern 951P is formed on the surface of the insulating base member 905. Furthermore, conductor patterns 961P and 962P are formed on the surface of the insulating base member 906.

An electronic component 21 is incorporated in the layer of the insulating base member 902 in the laminated body 900P. Mounting terminals 211 and 212 of the electronic component 21 face toward the insulating base member 903. The mounting terminal 211 is connected to the conductor pattern 931 through an interlayer connection conductor 331 formed at a position overlapping with the conductor pattern 931, in the insulating base member 903. The mounting terminal 212 is connected to the conductor pattern 932 through an interlayer connection conductor 332 formed at a position overlapping with the conductor pattern 932, in the insulating base member 903.

An electronic component 22 is incorporated in the layer of the insulating base member 905 in the laminated body 900P. Mounting terminals 221 and 222 of the electronic component 22 face toward the insulating base member 906. The mounting terminal 221 is connected to the conductor pattern 961P through an interlayer connection conductor 361P formed at a position overlapping with the conductor pattern 961P, in the insulating base member 906.

In this configuration, the electronic component 21 is connected to the conductor pattern 931 only through the interlayer connection conductor 331. Meanwhile, the electronic component 22 is connected to the conductor pattern 931 through the interlayer connection conductor 361P, the conductor pattern 961P, the interlayer connection conductor 363P, the conductor pattern 951P, the interlayer connection conductor 351P, the conductor pattern 941P, and the interlayer connection conductor 341P. Thus, the wiring for the electronic component 22 is long, which causes an increase in transmission loss.

SUMMARY OF THE INVENTION

Preferred embodiments of the present invention reduce a transmission loss in each electronic component, in a component incorporating substrate incorporating a plurality of electronic components.

A component incorporating substrate according to a preferred embodiment of the present invention includes a laminated body, a first electronic component and a second electronic component each disposed inside the laminated body and including a mounting terminal on a surface thereof. The laminated body includes a plurality of thermoplastic insulating base members including conductors only on first surfaces including a first insulating base member including a first conductor only on one surface and a second insulating base member including a second conductor only on one surface. The laminated body includes a common conductor pattern connected to the first electronic component and the second electronic component.

The common conductor pattern is disposed between the first electronic component and the second electronic component in a lamination direction.

In the first insulating base member, a first conductor-less surface which is opposite to the main surface including the first conductor abuts the first electronic component, and an interlayer connection conductor is located at a position overlapping with the first conductor to connect the mounting terminal of the first electronic component to the first conductor. In the second insulating base member, a second conductor-less surface which is opposite to the main surface including the second conductor abuts the second electronic component, and an interlayer connection conductor is located at a position overlapping with the second conductor to connect the mounting terminal of the second electronic component to the second conductor. The first insulating base member is disposed with the main surface including the first conductor abutting on the second insulating base member in the lamination direction. The second insulating base member is disposed with the main surface including the second conductor abutting on the first insulating base member in the lamination direction. The first insulating base member and the second insulating base member are bonded by heating under pressure.

In this configuration, the conductor between the common conductor pattern and the first electronic component, and the conductor between the common conductor pattern and the second electronic component are both reduced in length.

Furthermore, according to the component incorporating substrate in a preferred embodiment of the present invention, it is preferable that an abutment portion between the first conductor and the second conductor exits in a region between the first electronic component and the second electronic component in the lamination direction, and an alloy layer is located between the first conductor and the second conductor.

In this configuration, connection reliability for the abutment surface between the conductors is able to be improved.

Furthermore, according to a component incorporating substrate in a preferred embodiment of the present invention, it is preferable that the first conductor is a common wiring pattern connected to the first electronic component and the second electronic component.

In this configuration, the conductor between the common conductor pattern and the first electronic component, and the conductor between the common conductor pattern and the second electronic component are both reduced in length.

Furthermore, a method for manufacturing a component incorporating substrate according to a preferred embodiment of the present invention preferably includes the following steps.

The method for manufacturing a component incorporating substrate includes a step of preparing a plurality of thermosetting insulating base members including conductors only on first surfaces thereof including a first insulating base member including a first conductor only on one surface and a second insulating base member including a second conductor only on one surface.

The method for manufacturing a component incorporating substrate includes a step of forming a through hole at a position overlapping with the first conductor, in the first insulating base member, and filling the through hole with electrically-conductive paste.

The method for manufacturing a component incorporating substrate includes a step of forming a through hole at a position overlapping with the second conductor, in the second insulating base member, and filling the through hole with electrically-conductive paste.

The method for manufacturing a component incorporating substrate includes a step of laminating the plurality of insulating base members such that a first conductor-less surface which is opposite to the main surface including the first conductor of the first insulating base member abuts a mounting terminal-exposed surface of a first electronic component, a second conductor-less surface which is opposite to the main surface including the second conductor of the second insulating base member abuts a mounting terminal-exposed surface of a second electronic component, the main surface including the first conductor of the first insulating base member abuts the second insulating base member, and the main surface including the second conductor of the second insulating base member abuts the first insulating base member.

The method for manufacturing a component incorporating substrate includes a step of heating the laminated plurality of insulating base members under pressure applied in a lamination direction.

According to this manufacturing method, it is possible to easily manufacture the component incorporating substrate which is small in transmission loss for each electronic component of the plurality of incorporated electronic components.

Preferred embodiments of the present invention are able to provide the component incorporating substrate which is small in transmission loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
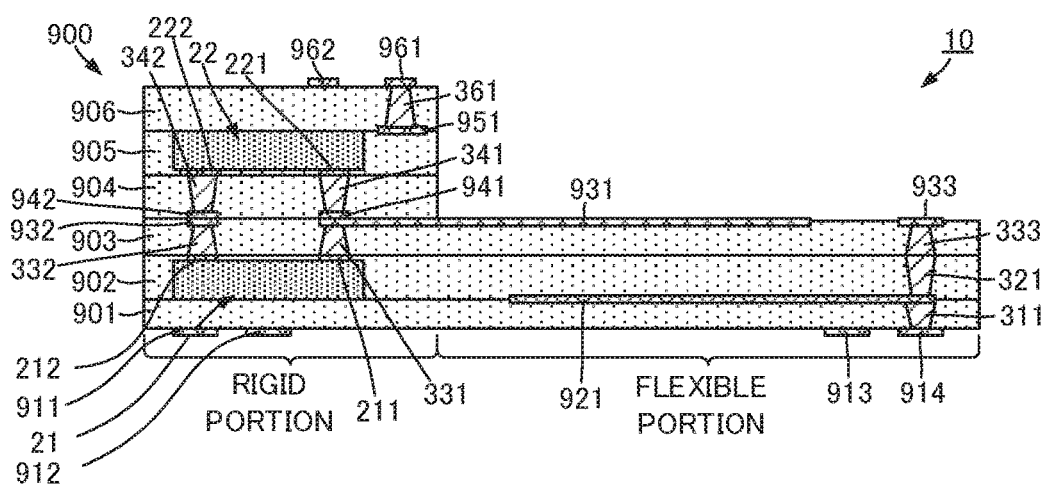
FIG. 1 is a side surface cross-sectional view illustrating a structure of a component incorporating substrate according to a first preferred embodiment of the present invention.
Figure 2:
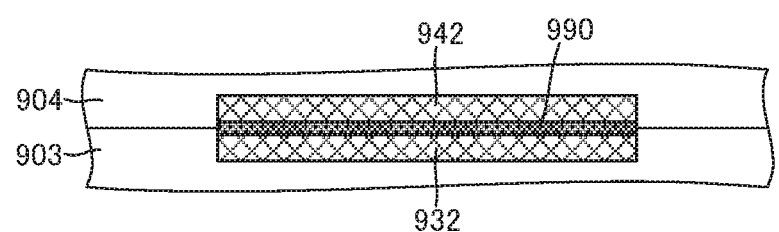
FIG. 2 is an enlarged cross-sectional view of a bonding portion of the component incorporating substrate according to the first preferred embodiment of the present invention.
Figure 4:
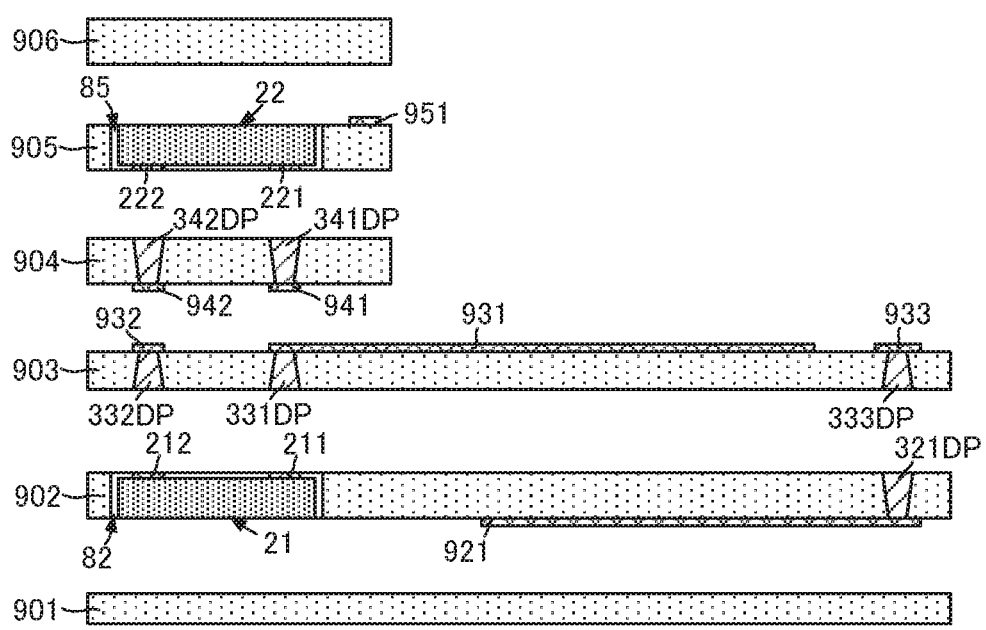
FIG. 4 is a side surface cross-sectional view illustrating a structure of the component incorporating substrate according to the first preferred embodiment of the present invention before bonded by heating under pressure.

A component incorporating substrate according to the first preferred embodiment of the present invention will be described with reference to the drawings. FIG. 1 is a side surface cross-sectional view illustrating a structure of the component incorporating substrate in the first preferred embodiment of the present invention. FIG. 2 is an enlarged cross-sectional view of a bonding portion of the component incorporating substrate according to the first preferred embodiment of the present invention. FIG. 4 is a side surface cross-sectional view illustrating a structure of the component incorporating substrate according to the first preferred embodiment of the present invention before it is bonded by heating under pressure.

As illustrated in FIG. 1, a component incorporating substrate 10 according to the first preferred embodiment of the present invention includes a laminated body 900 including a plurality of insulating base members 901 to 906. Each of the insulating base members 901 to 906 preferably is a thermoplastic resin film. The thermoplastic resin preferably includes liquid crystalline polymer as a major component, for example. The insulating base members 901 to 906 include conductors provided only on one of the two film surfaces thereof. For example, the insulating base members 901 to 906 include copper provided on only first surfaces thereof.

The insulating base members 901, 902, and 903 have an equal area or substantially equal area. The insulating base members 904, 905, and 906 have an equal area or substantially equal area which is smaller than that of the insulating base members 901, 902, and 903. Therefore, the laminated body 900 differs in thickness between the laminated portion of the insulating base members 901 to 906 and the laminated portion of the insulating base members 901, 902, and 903. The laminated portion of the insulating base members 901 to 906 has almost no flexibility. That is, the laminated portion of the insulating base members 901 to 906 is a rigid portion in the component incorporating substrate 10. The laminated portion of the insulating base members 901, 902, and 903 has flexibility. That is, the laminated portion of the insulating base members 901, 902, and 903 is a flexible portion in the component incorporating substrate 10.

The insulating base member 902 corresponds to a "third insulating base member", and the insulating base member 903 corresponds to a "first insulating base member". The insulating base member 904 corresponds to a "second insulating base member", and the insulating base member 905 corresponds to a "fourth insulating base member". Of the two main surfaces (which perpendicular to a lamination direction) of the insulating base member 903, the surface on which the conductor is not provided corresponds to a "first conductor-less surface", and of the two main surfaces (which are perpendicular or substantially perpendicular to a lamination direction) of the insulating base member 904, the surface on which the conductor is not provided corresponds to a "second conductor-less surface".

The conductor-containing surface of the insulating base member 902 abuts the conductor-less surface of the insulating base member 901. The conductor-less surface of the insulating base member 902 abuts the conductor-less surface of the insulating base member 903. The conductor-containing surface of the insulating base member 903 abuts the conductor-containing surface of the insulating base member 904. The conductor-less surface of the insulating base member 904 abuts the conductor-less surface of the insulating base member 905. The conductor-containing surface of the insulating base member 905 abuts the conductor-less surface of the insulating base member 906.

As described above, due to the configuration in which the conductor-less surface of the insulating base member 902 abuts the conductor-less surface of the insulating base member 903, a distance between a conductor pattern 921 and a conductor pattern 931 in the lamination direction of the insulating base members is able to be adjusted without changing the thickness of the insulating base member.

In addition, as described above, in laminating the insulating base members, the relationship between the conductor-containing surface and the conductor-less surface of the insulating base members is reversed in the middle of the lamination direction, so that a conductor pattern to mount a component and a conductor pattern to mount the laminated body 900 are able to be provided on both end surfaces of the laminated body 900 in the lamination direction.

Conductor patterns 911, 912, 913, and 914 are provided on the conductor-containing surface of the insulating base member 901. This surface is a mounting surface to mount the laminated body 900 (component incorporating substrate 10) on another circuit substrate, and the conductor patterns 911, 912, 913, and 914 define and function as externally connecting terminals in the component incorporating substrate 10.

The conductor pattern 921 is provided on a boundary surface between the insulating base member 901 and the insulating base member 902 in the laminated body 900. The conductor pattern 921 is connected to the conductor pattern 914 through an interlayer connection conductor 311 provided in the insulating base member 901.

The conductor patterns 931, 932, and 933 are provided on a boundary surface between the insulating base member 903 and the insulating base member 904 in the laminated body 900. The conductor pattern 931 corresponds to a "common conductor pattern" and also corresponds to a "first conductor". The conductor pattern 932 defines and functions as a land conductor for an electronic component 21. The conductor pattern 933 is a land conductor for an external electronic component to be mounted on the component incorporating substrate 10.

One portion of the conductor pattern 931 and the conductor pattern 932 are disposed in the rigid portion in the laminated body 900. The other portion of the conductor pattern 931 and the conductor pattern 933 are disposed in the flexible portion in the laminated body 900.

The conductor pattern 933 is connected to the conductor pattern 921 through an interlayer connection conductor 333 located in the insulating base member 903 and an interlayer connection conductor 321 located in the insulating base member 902. One portion of the conductor pattern 931 and the conductor pattern 933 define and function as land conductors to mount an electronic component not incorporated in the component incorporating substrate 10 (refer to an electronic component 23 in FIG. 3).

Furthermore, conductor patterns 941 and 942 are provided on the boundary surface between the insulating base member 903 and the insulating base member 904 in the laminated body 900. The conductor patterns 941 and 942 define and function as land conductors for an electronic component 22. The conductor pattern 941 corresponds to a "second conductor".

When the laminated body 900 is seen in a planar view, the conductor pattern 941 overlaps with the conductor pattern 931, and the conductor pattern 942 overlaps with the conductor pattern 932. The conductor pattern 941 is bonded to the conductor pattern 931, and the conductor pattern 942 is bonded to the conductor pattern 932. In this case, as illustrated in FIG. 2, an alloy layer 990 is provided on a bonding surface between the conductor pattern 942 and the conductor pattern 932. The alloy layer 990 preferably includes copper, nickel, and tin (Cu—Ni—Sn alloy) when the conductor patterns 932 and 942 are composed of copper. When the alloy layer 990 is formed, a melting point of the bonding surface becomes high, which improves reliability.

Furthermore, a conductor pattern 951 is provided on a boundary surface between the insulating base member 905 and the insulating base member 906 in the laminated body 900.

Furthermore, conductor patterns 961 and 962 are provided on the conductor-containing surface of the insulating base member 906. The conductor patterns 961 and 962 define and function as land conductors to mount the electronic component not incorporated in the component incorporating substrate 10 (refer to an electronic component 24 in FIG. 3). The conductor pattern 961 is connected to the conductor pattern 951 through an interlayer connection conductor 361 located in the insulating base member 906.

The electronic component 21 includes mounting terminals 211 and 212 on its one surface. The electronic component 21 corresponds to a "first electronic component". The electronic component 22 includes mounting terminals 221 and 222 on its one surface. The electronic component 22 corresponds to a "second electronic component".

The electronic components 21 and 22 are disposed inside the rigid portion in the laminated body 900.

The electronic component 21 is disposed in a region of the insulating base member 902 in the laminated body 900. The mounting terminals 211 and 212 of the electronic component 21 face toward the insulating base member 903. The mounting terminals 211 and 212 are exposed from a boundary surface between the insulating base members 902 and 903. When the laminated body 900 is seen in a planar view, the mounting terminal 211 overlaps with the conductor pattern 931, and the mounting terminal 212 overlaps with the conductor pattern 932. The mounting terminal 211 is connected to the conductor pattern 931 through an interlayer connection conductor 331 located in the insulating base member 903. The mounting terminal 212 is connected to the conductor pattern 932 through an interlayer connection conductor 332 located in the insulating base member 903.

The electronic component 22 is disposed in a region of the insulating base member 905 in the laminated body 900. The mounting terminals 221 and 222 of the electronic component 22 face toward the insulating base member 904. The mounting terminals 221 and 222 are exposed from a boundary surface between the insulating base members 904 and 905. When the laminated body 900 is seen in a planar view, the mounting terminal 221 overlaps with the conductor pattern 941, and the mounting terminal 222 overlaps with the conductor pattern 942. The mounting terminal 221 is connected to the conductor pattern 941 through an interlayer connection conductor 341 located in the insulating base member 904. The mounting terminal 222 is connected to the conductor pattern 942 through an interlayer connection conductor 342 located in the insulating base member 904.

As described above, according to the configuration of this preferred embodiment, the conductor-containing surface of the insulating base member 903 including the interlayer connection conductors 331 and 332 and the conductor patterns 931 and 932 connected to the mounting terminals 211 and 212 of the electronic component faces toward the insulating base member 904 including the interlayer connection conductors 341 and 342 and the conductor patterns 941 and 942 connected to the mounting terminals 221 and 222 of the electronic component 22. Furthermore, the conductor-containing surface of the insulating base member 904 faces toward the insulating base member 903.

The conductor pattern 931 defining and functioning as the common conductor pattern is provided on the boundary surface between the insulating base member 903 and the insulating base member 904.

In the lamination direction, the mounting terminals 211 and 212 of the electronic component 21 face toward the conductor pattern 931, and the mounting terminals 221 and 222 of the electronic component 22 face toward the conductor pattern 931.

When the laminated body 900 is seen in a planar view, the mounting terminal 211, the mounting terminal 221, and the one portion of the conductor pattern 931 overlap with each other.

Thus, the conductor pattern 931 and the mounting terminal 211 are connected only through the interlayer connection conductor 331, and the conductor pattern 931 and the mounting terminal 221 are connected only through the conductor pattern 941 and the interlayer connection conductor 341. In this case, the conductor to connect the conductor pattern 931 to the electronic component 21 is able to be reduced in length, and the conductor to connect the conductor pattern 931 to the electronic component 22 is able to be reduced in length. Therefore, it is possible to reduce a transmission loss of a high-frequency signal to the two electronic components 21 and 22 incorporated in the laminated body 900, so that it is possible to provide the component incorporating substrate 10 which is reduced in transmission loss.

Figure 6:
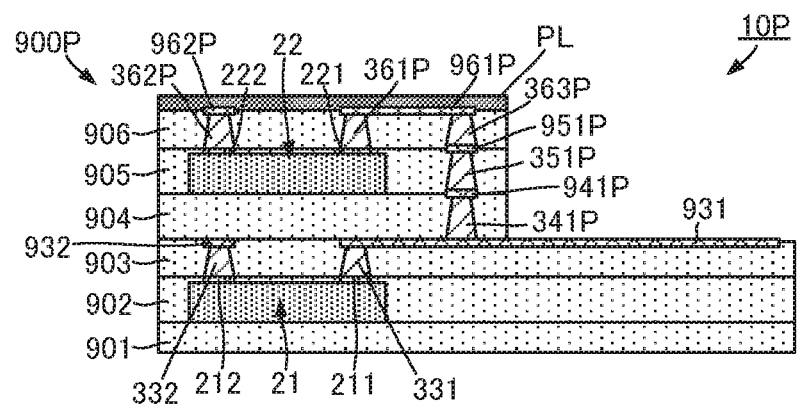
FIG. 6 is a side surface cross-sectional view illustrating wiring patterns of a component incorporating substrate provided based on a conventional configuration.

Furthermore, there is no need to provide the wiring patterns to transmit the signal to the electronic component 22, in the rigid portion separately from the region of the electronic component 22 as illustrated in FIG. 6. As a result, the rigid portion is able to be reduced in area, and the component incorporating substrate 10 is able to be reduced in size.

Furthermore, according to the configuration in this preferred embodiment, when the laminated body 900 is seen in a planar view, the electronic component 21 and the electronic component 22 overlap with each other, so that the rigid portion is further reduced in area.

Furthermore, according to the configuration in this preferred embodiment, the mounting terminal 211 of the electronic component 21 overlaps with the mounting terminal 221 of the electronic component 22, so that it is possible to further reduce the transmission loss of the high-frequency signal between the conductor pattern 931, and the electronic components 21 and 22.

Furthermore, according to the configuration in this preferred embodiment, the conductor pattern 931 defining and functioning as the common conductor pattern is also the land conductor pattern connected to the mounting terminal 211 of the electronic component 21 through the interlayer connection conductor 331. As a result, it is possible to further reduce the transmission loss of the high-frequency signal.

Furthermore, according to the configuration in this preferred embodiment, each of the electronic components 21 and 22 is connected to the conductor pattern 931 defining and functioning as the common conductor pattern only through the one insulating base member. Therefore, it is possible to further reduce the transmission loss of the high-frequency signal, and a height (thickness) of the rigid portion is able to be reduced, so that the component incorporating substrate 10 is able to be reduced in height.

Furthermore, according to the configuration in this preferred embodiment, the insulating base members 901 and 906 not including the conductor are disposed on both ends in the lamination direction. The insulating base members 901 and 906 are provided to protect the electronic components 21 and 22 and the conductor patterns, and they may be omitted.

Figure 3:
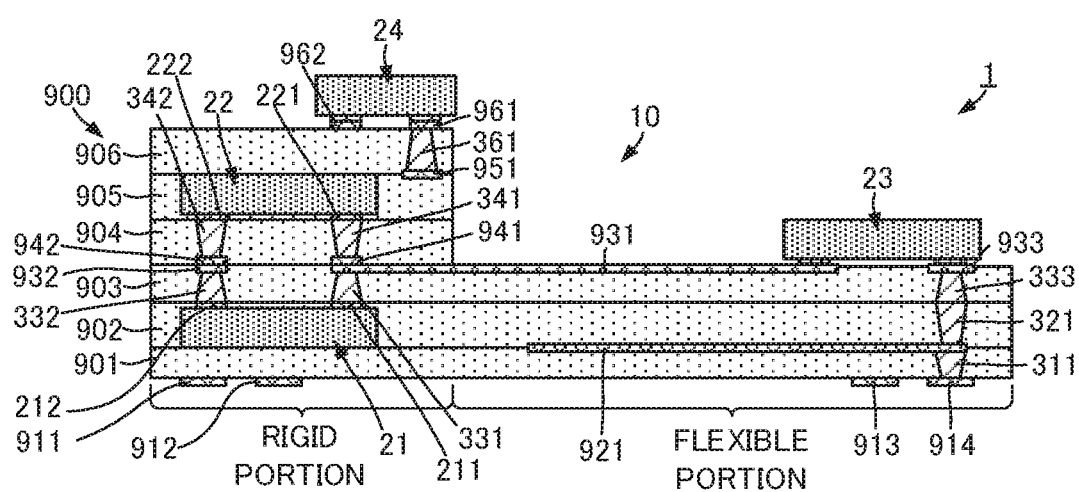
FIG. 3 is a side surface cross-sectional view illustrating a configuration of a circuit substrate according to the first preferred embodiment of the present invention.

The component incorporating substrate 10 including the above configuration may be used for a circuit substrate illustrated in FIG. 3. FIG. 3 is a side surface cross-sectional view illustrating a configuration of a circuit substrate in the first preferred embodiment of the present invention. A circuit substrate 1 includes the component incorporating substrate 10 and exterior electronic components 23 and 24. The component incorporating substrate 10 preferably has the configuration described above. The electronic component 23 is mounted on the conductor patterns 931 and 933 of the component incorporating substrate 10. The electronic component 24 is mounted on the conductor patterns 961 and 962 of the component incorporating substrate 10.

According to this configuration, it is possible to reduce a transmission loss of a high-frequency signal between the electronic component 23 and the electronic component 21, and a transmission loss of a high-frequency signal between the electronic component 23 and the electronic component 22.

The component incorporating substrate 10 is preferably manufactured according to the following example method.

First, the insulating base members 902, 903, 904, and 905 each including copper coating on only one surface, and the insulating base members 901 and 906 each without any copper coating are prepared. The insulating base members 901 to 906 are each made of thermoplastic resin and contain liquid crystal polymer as a major component, for example.

The conductor pattern 921 is formed on the conductor-containing surface of the insulating base member 902 by a patterning process. The conductor patterns 931, 932, and 933 are formed on the conductor-containing surface of the insulating base member 903 by a patterning process. The conductor patterns 941 and 942 are formed on the conductor-containing surface of the insulating base member 904 by a patterning process. The conductor pattern 951 is formed on the conductor-containing surface of the insulating base member 905 by a patterning process.

A hole 82 is located in the insulating base member 902 to penetrate in a thickness direction of the insulating base member 902. A through hole 85 is located in the insulating base member 905 to penetrate in a thickness direction of the insulating base member 905.

A through hole which penetrates the insulating base member 902 from the conductor-less surface is formed at a predetermined position corresponding to the conductor pattern 921 in the insulating base member 902 and filled with an electrically-conductive paste 321DP.

A through hole which penetrates the insulating base member 903 from the conductor-less surface is formed at a predetermined position corresponding to the conductor pattern 931 in the insulating base member 903 and filled with an electrically-conductive paste 331DP. A through hole which penetrates the insulating base member 903 from the conductor-less surface is formed at a predetermined position corresponding to the conductor pattern 932 in the insulating base member 903 and filled with an electrically-conductive paste 332DP. A through hole which penetrates the insulating base member 903 from the conductor-less surface is formed at a predetermined position corresponding to the conductor pattern 933 in the insulating base member 903 and filled with an electrically-conductive paste 333DP.

A through hole which penetrates the insulating base member 904 from the conductor-less surface is formed at a predetermined position corresponding to the conductor pattern 941 in the insulating base member 904 and filled with an electrically-conductive paste 341DP. A through hole which penetrates the insulating base member 904 from the conductor-less surface is formed at a predetermined position corresponding to the conductor pattern 942 in the insulating base member 904 and filled with an electrically-conductive paste 342DP.

Here, the electrically-conductive paste is fluid. However, as described above, in the component incorporating substrate 10 in this preferred embodiment, the through hole in each insulating base member is blocked by the conductor at one end. Therefore, this conductor defines and functions as a bottom of the through hole and prevents the electrically-conductive paste from leaking from the through hole, so that the component incorporating substrate 10 is able to be easily manufactured, and reliability of the interlayer connection conductor is able to be improved.

The electronic component 21 is inserted in the hole 82 of the insulating base member 902. At this time, the electronic component 21 is disposed with the mounting terminals 211 and 212 facing toward the conductor-less surface. The electronic component 22 is inserted in the hole 85 in the insulating base member 905. At this time, the electronic component 22 is disposed with the mounting terminals 221 and 222 facing toward the conductor-less surface.

The insulating base members 901 to 906 are laminated under the following conditions.

The conductor-less surface of the insulating base member 902 abuts the conductor-less surface of the insulating base member 903. The conductor-containing surface of the insulating base member 903 abuts the conductor-containing surface of the insulating base member 904. The conductor-less surface of the insulating base member 904 abuts the conductor-less surface of the insulating base member 905. At this time, a bonding material is applied to each of an abutment surface between the conductor patterns 931 and 941, and an abutment surface between the conductor patterns 932 and 942.

The laminated insulating base members 901 to 906 are heated and integrated while a pressure is applied at least in the lamination direction. At this time, the electrically-conductive pastes 321DP, 331DP, 332DP, 333DP, 341DP, and 342DP are solidified, such that the interlayer connection conductors 321, 331, 332, 333, 341, and 342 are formed. Furthermore, the bonding material reacts with the conductor pattern, such that the alloy layer is formed in each of the interface between the conductor patterns 931 and 941, and the interface between the conductor patterns 932 and 942. In addition, the holes 82 and 85 are filled with insulating resin. Thus, the laminated body 900 is completed.

By this manufacturing method, the component incorporating substrate 10 which is small in transmission loss is able to be easily manufactured.

Second Preferred Embodiment

Figure 5:
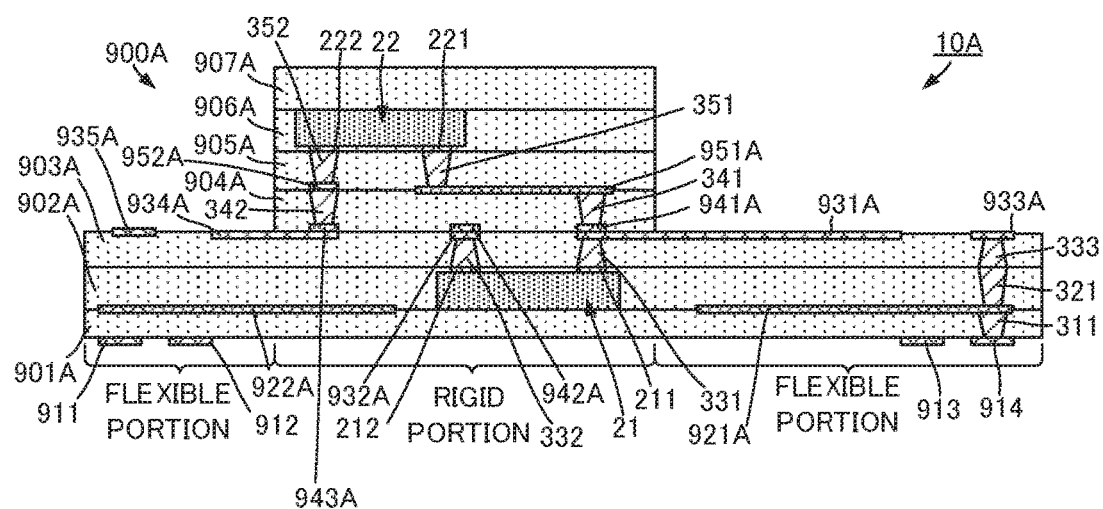
FIG. 5 is a side surface cross-sectional view illustrating a structure of a component incorporating substrate according to a second preferred embodiment of the present invention.

A component incorporating substrate according to a second preferred embodiment of the present invention will be described with reference to the drawings. FIG. 5 is a side surface cross-sectional view illustrating a structure of the component incorporating substrate according to the second preferred embodiment of the present invention.

As illustrated in FIG. 5, a component incorporating substrate 10A according to the second preferred embodiment of the present invention includes a laminated body 900A including a plurality of insulating base members 901A to 907A. Each of the insulating base members 901A to 907A preferably is a thermoplastic resin film. The thermoplastic resin contains liquid crystalline polymer as a major component, for example. Each of the insulating base members 901A to 905A includes copper located on one surface and is made of thermoplastic resin. Each of the insulating base members 906A and 907A does not have any conductor and is made of thermoplastic resin.

The insulating base members 901A, 902A, and 903A have an equal area or substantially equal area. The insulating base members 904A, 905A, 906A, and 907A have an equal area or substantially equal area which is smaller than the area of the insulating base members 901A, 902A, and 903A. Therefore, the laminated body 900A differs in thickness between the laminated portion of the insulating base members 901A to 907A and the laminated portion of the insulating base members 901A, 902A, and 903A. The laminated portion of the insulating base members 901A to 907A has almost no flexibility. That is, the laminated portion of the insulating base members 901A to 907A is a rigid portion of the component incorporating substrate 10A. The laminated portion of the insulating base members 901A, 902A, and 903A has flexibility. That is, the laminated portion of the insulating base members 901A, 902A, and 903A is a flexible portion in the component incorporating substrate 10A. Unlike the component incorporating substrate 10 in the first preferred embodiment, the component incorporating substrate 10A includes the flexible portions on both sides of the rigid portion, in a direction perpendicular or substantially perpendicular to the lamination direction.

The insulating base member 902A corresponds to a "third insulating base member", and the insulating base member 903A corresponds to a "first insulating base member". The insulating base member 905A corresponds to a "second insulating base member", and the insulating base member 906A corresponds to a "fourth insulating base member".

The conductor-containing surface of the insulating base member 902A abuts the insulating base member 901A. The conductor-less surface of the insulating base member 902A abuts the conductor-less surface of the insulating base member 903A. The conductor-containing surface of the insulating base member 903A abuts the conductor-containing surface of the insulating base member 904A. The conductor-less surface of the insulating base member 904A abuts the conductor-containing surface of the insulating base member 905A. The conductor-less surface of the insulating base member 905A abuts the insulating base member 906A.

Conductor patterns 911, 912, 913, and 914 are provided on the conductor-containing surface of the insulating base member 901A. This surface is a mounting surface to mount the laminated body 900A (component incorporating substrate 10A) on another circuit substrate, and the conductor patterns 911, 912, 913, and 914 define and function as externally connecting terminals in the component incorporating substrate 10A.

Conductor patterns 921A and 922A are provided on a boundary surface between the insulating base member 901A and the insulating base member 902A in the laminated body 900A.

Conductor patterns 931A, 932A, 933A, 934A, and 935A are provided on a boundary surface between the insulating base member 903A and the insulating base member 904A in the laminated body 900A. The conductor pattern 931A corresponds to a "common conductor pattern" and also corresponds to a "first conductor". The conductor pattern 932A defines and functions as a land conductor for an electronic component 21. Each of the conductor patterns 933A and 935A is preferably used as a land conductor or an input/output electrode for an external electronic component to be mounted on the component incorporating substrate 10A. The conductor pattern 934A defines and functions as a wiring conductor and also a land conductor for an external electronic component to be mounted on the component incorporating substrate 10A.

First portions of the conductor pattern 931A and 934A, and the conductor pattern 932A are disposed in the rigid portion in the laminated body 900A. Second portions of the conductor pattern 931A and the conductor pattern 934A, and the conductor patterns 933A and 935A are disposed in the flexible portions in the laminated body 900A.

The conductor pattern 933A is connected to the conductor pattern 921A through an interlayer connection conductor 333 located in the insulating base member 903A and an interlayer connection conductor 321 located in the insulating base member 902A.

Furthermore, conductor patterns 941A, 942A, and 943A are provided on the boundary surface between the insulating base member 903A and the insulating base member 904A in the laminated body 900A.

When the laminated body 900A is seen in a planar view, the conductor pattern 941A overlaps with the conductor pattern 931A, and the conductor pattern 942A overlaps with the conductor pattern 932A. The conductor pattern 943A overlaps with the conductor pattern 934A. The conductor pattern 941A is bonded to the conductor pattern 931A, and the conductor pattern 942A is bonded to the conductor pattern 932A. The conductor pattern 943A is bonded to the conductor pattern 934A. In this case, an alloy layer is provided on each bonding surface similar to the first preferred embodiment.

Furthermore, conductor patterns 951A and 952A are provided on a boundary surface between the insulating base member 905A and the insulating base member 906A in the laminated body 900A. The conductor pattern 951A defines and functions as a conductor pattern to connect the electronic component 22 to the conductor pattern 931A, and also defines and functions as a land conductor for the electronic component 22. The conductor pattern 951A corresponds to a "second conductor". The conductor pattern 952A defines and functions as a land conductor for the electronic component 22.

The conductor pattern 951A is connected to the conductor pattern 931A through an interlayer connection conductor 341 located in the insulating base member 904A. The conductor pattern 952A is connected to the conductor pattern 943A through an interlayer connection conductor 342 located in the insulating base member 904A.

The electronic components 21 and 22 are disposed inside the rigid portion in the laminated body 900A.

The electronic component 21 is disposed in a region of the insulating base member 902A in the laminated body 900A. Mounting terminals 211 and 212 of the electronic component 21 face toward the insulating base member 903A. The mounting terminals 211 and 212 are exposed from a boundary surface between the insulating base members 902A and 903A. When the laminated body 900A is seen in a planar view, the mounting terminal 211 overlaps with the conductor pattern 931A, and the mounting terminal 212 overlaps with the conductor pattern 932A. The mounting terminal 211 is connected to the conductor pattern 931A through an interlayer connection conductor 331 located in the insulating base member 903A. The mounting terminal 212 is connected to the conductor pattern 932A through an interlayer connection conductor 332 located in the insulating base member 903A.

The electronic component 22 is disposed in a region of the insulating base member 906A in the laminated body 900A. Mounting terminals 221 and 222 of the electronic component 22 face toward the insulating base member 905A. The mounting terminals 221 and 222 are exposed from a boundary surface between the insulating base members 905A and 906A. When the laminated body 900A is seen in a planar view, the mounting terminal 221 overlaps with the conductor pattern 951A, and the mounting terminal 222 overlaps with the conductor pattern 952A. The mounting terminal 221 is connected to the conductor pattern 951A through an interlayer connection conductor 351 located in the insulating base member 905A. The mounting terminal 222 is connected to the conductor pattern 952A through an interlayer connection conductor 352 located in the insulating base member 905A.

As described above, according to the configuration in this preferred embodiment, the conductor-containing surface of the insulating base member 903A including the interlayer connection conductors 331 and 332 and the conductor patterns 931A and 932A connected to the mounting terminals 211 and 212 of the electronic component 21 faces toward the insulating base member 905A including the interlayer connection conductors 351 and 352 and the conductor patterns 951A and 952A connected to the mounting terminals 221 and 222 of the electronic component 22. Furthermore, the conductor-containing surfaces of the insulating base members 905A and 904A face toward the insulating base member 903A.

The conductor pattern 931A as the common conductor pattern is provided on the boundary surface between the insulating base member 903A and the insulating base member 904A.

In the lamination direction, the mounting terminals 211 and 212 of the electronic component 21 face toward the conductor pattern 931A, and the mounting terminals 221 and 222 of the electronic component 22 face toward the conductor pattern 931A.

When the laminated body 900A is seen in a planar view, the electronic component 21 and the electronic component 22 only partially overlap with each other. Furthermore, the electronic component 21 and the electronic component 22 are not always required to overlap with each other when the laminated body 900A is seen in a planar view.

In this configuration also, similar to the first preferred embodiment, it is possible to reduce a transmission loss of a high-frequency signal to the two electronic components 21 and 22 incorporated in the laminated body 900A, and the component incorporating substrate 10A is small in transmission loss.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component incorporating substrate comprising:
 a laminated body including a plurality of thermoplastic insulating base members each including conductors on only one surface thereof and laminated in a lamination direction, the plurality of insulating base layers including a first insulating base member including a first conductor only on one surface thereof and a second insulating base member including a second conductor only on one surface thereof;
 a first electronic component and a second electronic component each disposed inside the laminated body and including a mounting terminal on one surface thereof; and
 a common conductor pattern connected to the first electronic component and the second electronic component; wherein
 the common conductor pattern is disposed between the first electronic component and the second electronic component in the lamination direction;
 in the first insulating base member, a first conductor-less surface which is opposite to the main surface including the first conductor abuts the first electronic component, and an interlayer connection conductor is located at a position overlapping with the first conductor to connect the mounting terminal of the first electronic component to the first conductor;
 in the second insulating base member, a second conductor-less surface which is opposite to the main surface including the second conductor abuts the second electronic component, and an interlayer connection conductor is located at a position overlapping with the second conductor to connect the mounting terminal of the second electronic component to the second conductor;
 the first insulating base member is disposed with the main surface including the first conductor abutting on the second insulating base member in the lamination direction;
 the second insulating base member is disposed with the main surface including the second conductor abutting on the first insulating base member in the lamination direction; and
 the first insulating base member and the second insulating base member are heat-pressure-bonded.

2. The component incorporating substrate according to claim 1, wherein an abutment portion between the first conductor and the second conductor is located in a region between the first electronic component and the second electronic component in the lamination direction, and an alloy layer is located between the first conductor and the second conductor.

3. The component incorporating substrate according to claim 1, wherein the first conductor is the common conductor pattern.

4. The component incorporating substrate according to claim 1, wherein each of the plurality of thermoplastic insulating base members is made of liquid crystalline polymer and includes copper provided only on the one surface thereof to define the conductor.

5. The component incorporating substrate according to claim 1, wherein thermoplastic insulating base members of a first group of the plurality of thermoplastic insulating base members have an equal or substantially equal size, and thermoplastic insulating base members of a second group of the plurality of thermoplastic insulating base members have an equal or substantially equal size smaller than that of the thermoplastic insulating base members of the first group of the plurality of thermoplastic insulating base members.

6. The component incorporating substrate according to claim 1, wherein the laminated body includes a first portion that has flexibility, and a second portion has substantially no flexibility and defines a rigid portion.

7. The component incorporating substrate according to claim 6, wherein the first and second electronic components are located in the rigid portion.

8. The component incorporating substrate according to claim 1, wherein the first electronic component overlaps with the second electronic component.

9. The component incorporating substrate according to claim 1, wherein the mounting terminal of the first electronic component overlaps with the mounting terminal of the second electronic component.

10. The component incorporating substrate according to claim 1, wherein the common conductor pattern is connected to the mounting terminal of the first electronic component through the interlayer connection conductor.

11. The component incorporating substrate according to claim 1, wherein the first and second electronic components are connected to the common conductor pattern only though one of the insulating base members.

12. The component incorporating substrate according to claim 1, wherein at least two of the plurality of insulating base members do not include any conductor on surfaces thereof, and the at least two of the plurality of insulating base members are located on opposite ends of the laminated body.

13. The component incorporating substrate according to claim 1, wherein the laminated body includes at least two first portions each with flexibility, and at least one second portion has substantially no flexibility and defines a rigid portion, and the at least two first portions are located on both sides of the rigid portion.

14. The component incorporating substrate according to claim 13, wherein the first and second electronic components are located in the rigid portion.

15. The component incorporating substrate according to claim 1, wherein the first and second electronic components only partially overlap with each other when seen in a planar view.

16. A method for manufacturing a component incorporating substrate, the method comprising the steps of:
   preparing a plurality of thermosetting insulating base members each including a conductor on only one surface thereof, the plurality of insulating base members including a first insulating base member including a first conductor only on one surface thereof and a second insulating base member including a second conductor only on one surface thereof;
   forming a through hole at a position overlapping with the first conductor, in the first insulating base member, and filling the through hole with electrically-conductive paste;
   forming a through hole at a position overlapping with the second conductor, in the second insulating base member, and filling the through hole with electrically-conductive paste;
   laminating the plurality of insulating base members in a lamination direction such that a first conductor-less surface which is opposite to the main surface including the first conductor of the first insulating base member abuts a mounting terminal-exposed surface of a first electronic component, a second conductor-less surface which is opposite to the main surface including the second conductor of the second insulating base member abuts a mounting terminal-exposed surface of a second electronic component, the main surface including the first conductor of the first insulating base member abuts the second insulating base member, and the main surface including the second conductor of the second insulating base member abuts the first insulating base member; and
   heating the laminated plurality of insulating base members under pressure applied in the lamination direction.

17. The method according to claim 16, wherein each of the plurality of thermoplastic insulating base members is made of liquid crystalline polymer and includes copper provided only on the one surface thereof to define the conductor.

18. The method according to claim 16, wherein thermoplastic insulating base members of a first group of the plurality of thermoplastic insulating base members have an equal or substantially equal size, and thermoplastic insulating base members of a second group of the plurality of thermoplastic insulating base members have an equal or substantially equal size smaller than that of the thermoplastic insulating base members of the first group of the plurality of thermoplastic insulating base members.

19. The method according to claim 16, wherein the laminated body includes a first portion that has flexibility, and a second portion has substantially no flexibility and defines a rigid portion.

20. The method according to claim 19, wherein the first and second electronic components are located in the rigid portion.

* * * * *